(12) United States Patent
Gulpen et al.

(10) Patent No.: US 8,679,963 B2
(45) Date of Patent: Mar. 25, 2014

(54) FAN-OUT CHIP SCALE PACKAGE

(71) Applicant: NXP B.V., Eindhoven (NL)

(72) Inventors: Jan Gulpen, Nijmegen (NL); Tonny Kamphuis, Lent (NL); Pieter Hochstenbach, Nijmegen (NL); Leo Van Gemert, Nijmegen (NL); Eric Van Grunsven, Someren (NL); Marc De Samber, Lommel (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/916,430

(22) Filed: Jun. 12, 2013

(65) Prior Publication Data

US 2013/0273731 A1    Oct. 17, 2013

Related U.S. Application Data

(62) Division of application No. 12/648,634, filed on Dec. 29, 2009, now Pat. No. 8,482,136.

(51) Int. Cl.
*H01L 21/44* (2006.01)
*H01L 23/48* (2006.01)

(52) U.S. Cl.
USPC ............................. 438/613; 257/784; 257/786

(58) Field of Classification Search
None
See application file for complete search history.

(56) References Cited

U.S. PATENT DOCUMENTS

| | | | |
|---|---|---|---|
| 5,386,623 | A | 2/1995 | Okamoto et al. |
| 5,668,405 | A | 9/1997 | Yamashita |
| 5,751,060 | A | 5/1998 | Laine et al. |
| 5,990,546 | A | 11/1999 | Igarashi et al. |
| 6,011,694 | A | 1/2000 | Hirakawa |
| 6,051,450 | A | 4/2000 | Ohsawa et al. |
| 6,586,836 | B1 | 7/2003 | Ma et al. |
| 7,189,596 | B1 | 3/2007 | Mu et al. |
| 7,807,511 | B2 * | 10/2010 | Mangrum et al. ............ 438/127 |
| 2006/0157847 | A1 | 7/2006 | Hsu |
| 2006/0158804 | A1 | 7/2006 | Usui et al. |

OTHER PUBLICATIONS

International Search Report and Written Opinion in Application No. PCT/IB2010/056012 (Jun. 29, 2012).

* cited by examiner

*Primary Examiner* — Alonzo Chambliss

(57) ABSTRACT

A chip scale package has a semiconductor die having an array of die bond pads arranged with a bond pad density per unit area, embedded in a molded die support body having a surface supporting an array of conducting contacts, each of the contacts connected by an electrical lead to a corresponding one of the die bond pads.

14 Claims, 4 Drawing Sheets

FAN-OUT CHIP SCALE PACKAGE

CROSS-REFERNECE TO RELATED APPLICATIONS

This application is a division of copending application Ser. No. 12/648,634, filed on Dec. 29, 2009, the priority of which is again claimed, and the contents of each of which are incorporated by reference herein.

TECHNICAL FIELD

Embodiments relate generally to chip scale packages manufactured from semiconductor chips with an array of densely spaced bond pads.

BACKGROUND

Semiconductor dies or chips are frequently embedded in a molding composition to produce packages. In modern uses, small packages, commonly known as Chip Scale Packages, are frequently preferred. Chip Scale Packages, or CSPs, based on the IPC/JEDEC J-STD-012 definition, are single-die, direct surface mountable packages with an area no more than 20% greater than the original die area. The IPC/JEDEC definition does not specify a particular design or construction of a chip scale package, so any package that meets the surface mountability and dimensional requirements of the definition may be viewed as a CSP.

The advantages offered by chip scale packages include small size, reduced weight, and improvement in electrical performance. The small size of a CSP makes it useful in portable devices, such as cell phones, laptops, palmtops, and digital cameras.

Wafer-level Chip Scale Packages (WL-CSPs) may be made by extending wafer fabrication processes to include device interconnection and device protection processes. Redistribution Layer and Bump technology, the most widely-used WL-CSP technology, extends the conventional fabrication process with an additional step that deposits a thin-film metal rerouting and interconnection system on the surface of the wafer by photolithography and thin film deposition techniques. This metal rerouting and interconnection system redistributes the bonding pads from the periphery of the upper surface of each chip to an array of metal bonding pads that are evenly deployed over the chip's surface. The solder balls or bumps used in connecting the device to the application circuit board are subsequently placed over these evenly deployed bonding pads. This redistribution technique improves chip reliability by allowing the use of larger and more robust balls for interconnection between the bonding pads and the leadframe.

However, the WL-CSP technology described has inherent limitations because it arranges solder balls directly on a surface of the die and, since the solder balls must have greater than a certain minimum spacing to avoid contact between adjacent solder balls, the larger the number of solder balls that are required means the larger the required chip area. This requirement for a large area on which to arrange the solder bumps may still persist even after deposition of a redistribution layer with an array of metal bonding pads that are evenly deployed over the chip's surface.

SUMMARY

In light of the long-felt need for improvements in structure and function of electrical connections to spaced arrays of die bond pads, a brief summary of various embodiments is presented. Some simplifications and omissions may be made in the following summary, as this is intended to highlight and introduce illustrative aspects of the various examples, but not to limit the scope of the invention.

One or more various exemplary embodiments includes a semiconductor die embedded in a die support body formed of a molding composition, the semiconductor die having a die surface having a first area and having a plurality of first bond pads disposed in a first spaced arrangement on the first area, the first spaced arrangement having a first minimum center-to-center bond pad spacing, and includes a bond pad spacing interface structure supported, at least in part, by a layer support surface of the die support body, the bond pad spacing interface structure supporting a plurality of second bond pads in a second spaced arrangement over a second area, the second spaced arrangement having a second minimum center-to-center spacing that can be larger than the first minimum center-to-center spacing, and the bond pad spacing interface structure having a plurality of electrical conductors, each of the electrical conductors connecting a corresponding one of the first pads to a corresponding one or more of the second pads.

According to one aspect of various exemplary embodiments, the bond pad spacing interface structure includes a dielectric layer disposed on at least a portion of the first area of the semiconductor die, having a plurality of bond pad clearance openings, each bond pad clearance opening being aligned with a corresponding one of the second bond pads.

According to one aspect of various exemplary embodiments, the bond pad spacing interface structure includes a dielectric layer disposed on at least a portion of the first area of the semiconductor die, and disposed on at least a portion of the second area of the molding composition, the dielectric layer having a plurality of bond pad clearance openings, each bond pad clearance opening being aligned with a corresponding one of the second bond pads.

According to one aspect of various exemplary embodiments, the bond pad spacing interface structure includes a patterned conductive layer overlaying at least a portion of the dielectric layer and forming the electrical conductors.

According to one aspect of various exemplary embodiments, the bond pad spacing interface structure includes a solder mask disposed over at least a portion of the patterned conductive layer.

According to one aspect of various exemplary embodiments the bond pad density interface structure includes a solder bump disposed within a clearance opening of the solder mask, the solder bump having a bottom surface contacting one of the second bond pads and a top surface projecting outward beyond a surface plane of the solder mask.

According to one aspect of various exemplary embodiments, at least some of the second bond pads are disposed on the die support body so that, viewed substantially perpendicular to the plane in which the second bond pads lie, the second bond pads are located outside a projection of the perimeter of the semiconductor die.

According to one aspect of various exemplary embodiments, at least one first bond pad is electrically connected to another first bond pad.

Example methods of making a chip scale package according to one or more various exemplary embodiments include providing a semiconductor die having a first area supporting a plurality of first bond pads arranged in a first arrangement, and arranging a dielectric layer over at least a portion of the first area, embedding the semiconductor in a die support body formed of a molding material, in an orientation and position exposing at least a portion of the dielectric layer above the first area, and then opening holes in the dielectric layer to expose at least two of the first bond pads. Such example methods further include forming electrical leads on the dielectric layer, each of the electrical leads forming at least one second bond pad and extending from the at least one second bond to a corresponding one of the first bond pads, and then forming a conducting bump pad on at least one of the second bond pads.

According to one aspect of example methods having one or more various exemplary embodiments, an outer perimeter of the semiconductor die surrounds the first area, the dielectric layer is a self-supporting dielectric layer, the arranging of the dielectric layer over at least a portion of the first area arranges the self-supporting dielectric layer to have portions extending beyond the outer perimeter, and the embedding of the semiconductor in a die support body forms a layer support surface of the die support body at the extending portions of the dielectric layer.

According to one aspect of example methods having one or more various exemplary embodiments, the first bond pads are arranged in a first arrangement having a first minimum center-to-center bond pad spacing, and the forming a plurality of electrical leads on the dielectric layer forms the second bond pads in a second arrangement having a second minimum center-to-center bond pad spacing that can be larger than the first minimum center-to-center bond pad spacing.

According to one aspect of example methods having one or more various exemplary embodiments, at least some of the second bond pads are disposed on the die support body so that, viewed substantially perpendicular to the plane in which the second bond pads lie, the second bond pads are located outside a projection of the perimeter of the semiconductor die.

According to one aspect of example methods having one or more various exemplary embodiments, at least one first bond pad is electrically connected to another first bond pad.

BRIEF DESCRIPTION OF THE DRAWINGS

In order to facilitate a ready understanding of inventive concepts sufficient to practice according to various exemplary embodiments, reference is made to the accompanying drawings, wherein:

FIGS. 2-8 show various illustrative examples of a manufacture, and steps of a manufacture of a chip scale package according to one or more various embodiments, including an embodiment as illustrated at FIG. 1, wherein:

FIG. 2 shows one example of a semiconductor chip or die mounted on one example sacrificial substrate through an example intervening dielectric layer, as used in one example preparation of a chip scale package according to one or more of the various embodiments, including the example described in reference to FIG. 1 of the present disclosure;

FIG. 3 shows one illustrative example of a deposition of a molding composition over an example intervening dielectric layer, such as the example intervening layer depicted at FIG. 2, with a removal of an example sacrificial substrate;

FIG. 4 shows one illustrative example of a patterning of one example dielectric layer, such as the example dielectric layer depicted at FIG. 3;

FIG. 5 shows one illustrative example of a deposition of a conductive layer over one example patterned dielectric layer, such as the patterned dielectric layer of FIG. 4;

FIG. 6 shows one illustrative example of a patterning of one example of a conductive layer, such as the conductive layer of FIG. 5;

FIG. 7 shows one illustrative example of a deposition of a patterned solder mask over one example patterned conductive layer, such as the example patterned conductive layer illustrated at FIG. 6; and FIG. 8 shows one illustrative example of a deposition of solder bumps on one example patterned conductive layer through example openings in a patterned solder mask, such as the example patterned solder mask illustrated at FIG. 7.

DETAILED DESCRIPTION

Figure 1:
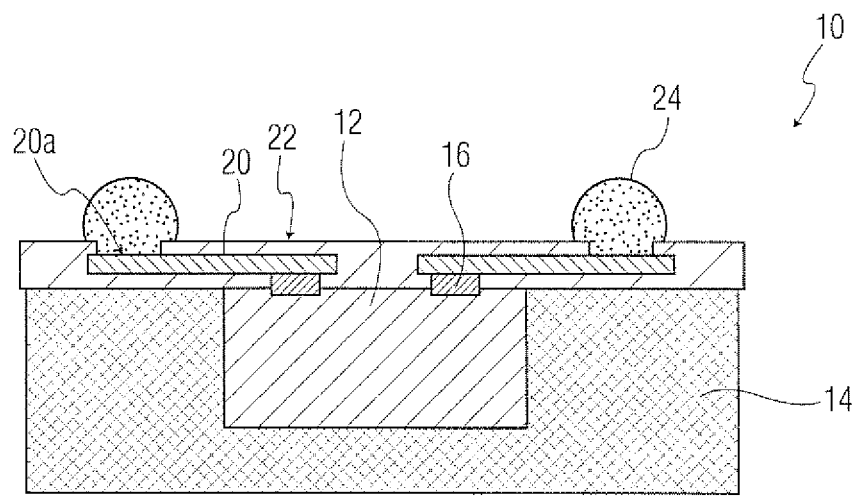
FIG. 1 shows an illustrative example chip scale package according to various embodiments.

Referring now to the drawings, in which like numerals refer to like components or steps, there are disclosed broad aspects of various example embodiments. FIG. 1 shows one example of a chip scale package 10 according to one or more example embodiments. The FIG. 1 example 10 chip scale package includes a semiconductor chip or die such as, for example, the depicted example 12, embedded in a composition 14 such as, for example, a polymeric molding composition or equivalent. One example composition 14 may be, but is not necessarily, an epoxy resin. Conducting bond pads 16 which may, for example, be metallic, may be deposited in an arrangement, such as the FIG. 1 depicted arrangement, this arrangement being arbitrarily termed in this description as a "first array," spaced array, on an exposed surface of chip or die 12. The first array of conducting bond pads 16 may be formed by bond pads positioned along a peripheral edge of the chip or die 12; or the first array of bond pads 16 may be formed by bond pads evenly distributed over an exposed surface of the chip or die 12. It will be understood that "array" does not limit the arrangement of the conducting bond pads 16 to an evenly spaced column row arrangement along perpendicular axes, and uneven arrays of bond pads also are contemplated. The first array of bond pads 16 has a corresponding first density, in terms of bond-pads per unit area, and a first minimum center-to-center spacing between neighboring bonding pads 16.

With continuing reference to FIG. 1, a dielectric layer 18 may be deposited over an area of, or over all the exposed surface of embedded chip or die 12. According to one aspect, at least a portion of the conducting bond pads 16 may be exposed through openings in the dielectric layer 18. A patterned conductive layer 20 may be deposited over the dielectric layer 18 so as to make electrical contact with the conducting bond pads 16 exposed through openings in the dielectric layer 18. Patterned conductive layer 20 may define a plurality of electrical leads, each of the leads extending from one of the exposed surface of the bond pads 16. Preferably, at least one of the electrical leads extends from a bond pad 16 across an interface between die or chip 12 and molding composition 14 onto the molding composition 14. Each electrical lead is preferably electrically isolated from all other electrical leads. A solder mask 22 may be deposited on the patterned conductive layer 20 and patterned to define openings which expose bond pads 20a, where each bond pad 20a is located at the end of an electrical lead defined by patterned conductive layer 20. Preferably, each bond pad 20a is located at the end of an electrical lead which is remote from a bond pad 16 and which is in electrical communication with that bond pad 16.

Solder bumps 24 may be deposited on bond pads 20a, where each solder bump makes electrical contact with a bond pad 16 through an electrical lead defined by conductive layer 20 and running from a bond pad 16 to an associated bond pad 20a. Bond pads 20a may be arranged to define what will be arbitrarily labeled in this description as a "second array" of bond pads, and such a second array of bond pads 20a preferably may be much less densely spaced than the first array of bond pads 16. This is by way of example only, and all spacing arrangements, whether more or less dense, and uniform or non-uniform, are contemplated. As will be readily understood by a person of ordinary skill in the art of chip packaging from this disclosure, when less dense spacing is used, because of the less dense spacing provided by these and other embodiments, solder balls deposited on bond pads 20a are much less likely to cause unwanted short circuits through direct contact between solder balls on different bond pads 20a than are solder balls deposited directly on closely spaced bond pads 16 as in the known art.

Figure 2:
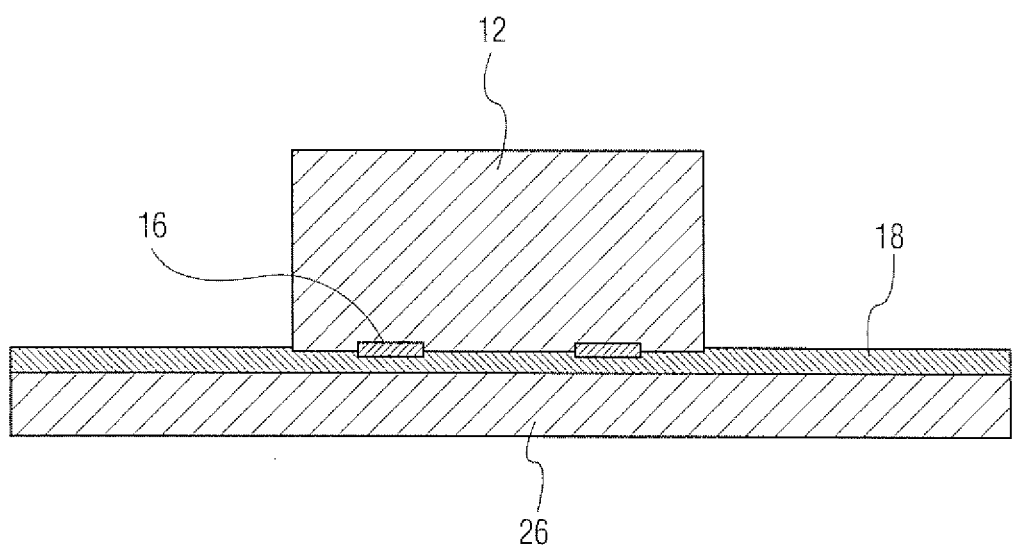

Illustrative examples of steps and processes of making a chip package having one or embodiments will now be described. In one illustrative example, a construction of one example chip package having one or more of the various exemplary embodiments may begin with an assembly such as shown in FIG. 2. In one example, at least one semiconductor die or chip 12 may be deposited on a dielectric layer 18, with bond pads 16 on die or chip 12 making contact with the dielectric layer 18. The dielectric layer 18 may be, but is not necessarily, a dielectric polymeric film (not separately shown) supported on a sacrificial substrate. The sacrificial substrate 26 may be a metal foil such as a copper foil, an aluminum foil, or a chromium foil. The sacrificial substrate 26 may be a flexible polymeric foil bonded to the dielectric layer 18 directly or through an optional release layer (not shown in the figures). According to one embodiment, the dielectric layer 26 may be a self-supporting polymeric film. The use of other materials also is contemplated.

In example embodiments forming the dielectric layer 18 as a dielectric polymeric film supported on a sacrificial substrate 26, the dielectric layer 18 may be a continuous layer covering an entire face of sacrificial substrate 26, as seen in FIG. 2. Alternatively, the dielectric layer 18 may be a discontinuous layer covering defined patches (not explicitly depicted), for example, evenly spaced square or rectangular patches, on a face of sacrificial substrate 26. Uneven arrangements also are contemplated. Each die or chip 12 may be deposited on a defined patch of a discontinuous dielectric layer 18 so that dielectric layer 18 prevents at least bond pads 16 on die or chip 12, and preferably the entire surface of die or chip 12, from contacting the sacrificial substrate 26, among other features and benefits.

In various exemplary embodiments, the semiconductor chip or die 12 may be a single crystal or polycrystalline semiconductor. The semiconductor chip or die 12 may be made from, for example, silicon; germanium; silicon carbide; silicon-germanium alloys ($Si_xGe_{1-x}$); antimonides, arsenides, nitrides, or phosphides of a Group III element selected from the group consisting of aluminum, gallium, indium, boron, or mixtures thereof; and oxides, sulfides, selenides or tellurides of a Group II element selected from the group consisting of zinc, cadmium, mercury, and mixtures thereof. Other useful semiconductors include Lead selenide (PbSe), Lead sulfide (PbS), Lead telluride (PbTe), Tin sulfide (SnS), Tin telluride (SnTe), Bismuth telluride ($Bi_2Te_3$), Cadmium phosphide ($Cd_3P_2$), Cadmium arsenide ($Cd_3As_2$), Cadmium antimonide ($Cd_3Sb_2$) Zinc phosphide ($Zn_3P_2$), Zinc arsenide ($Zn_3As_2$), Zinc antimonide ($Zn_3Sb_2$), Copper oxides, and Uranium oxides. Other compositions are also contemplated.

The dielectric layer 18 may be made from, for example, benzocyclobutene resin, a polyamide, a benzocyclobutene-modified polyamide, a benzocyclobutene-modified silicone, a silicone resin, a polyolefin resin, a diene resin, poly(methyl methacrylate), polysulfones, polyetherimides and/or styrene resins. According to one aspect of one or more various example embodiments, the polymeric dielectric layer 18 may be from about 0.1 to 50 microns thick, and preferably from about 1 to 10 microns thick. According to one aspect, the dielectric layer 18 may be a stress buffer material with a low moisture uptake and an elongation of from about 10% to 300%, preferably from about 20% to 50%. It also is desirable that the dielectric layer 18 be made from material which is strong enough to withstand the forces which may be applied during fabrication and assembly. One of the benefits and features of examples according to this aspect is that if the dielectric layer 18 and the semiconductor die 12 have a mismatched coefficient of thermal expansion so that the dielectric layer 18 and die 12 undergo different dimensional changes as a result of temperature changes, the dielectric layer can elongate as required to compensate for the differing size changes of the two materials. Among other further benefits and advantages, this feature provides a substantially reduced likelihood that the effects of a mismatched coefficient of thermal expansion will stretch or tear electrical leads formed from patterned conductive layer 20. The dielectric layer 18 may be deposited by, for example, spin coating/lamination on either the Si wafer or on the sacrificial substrate. Thus, the dielectric layer 18 serves as a stress buffer material which can decouple the patterned conductive layer 20 and the solder bumps 24 from the molding composition 14, and the transition from the semiconductor die 12 to the molding material 14.

The bond pads 16 on the silicon die may be formed from a metal having excellent conductivity such as, for example, copper, aluminum, gold, silver, or alloys thereof. The bond pads 16 may be formed by, for example, chemical vapor deposition, physical vapor deposition, electroplating, electroless plating, or sputtering, or any other suitable technique.

Figure 3:
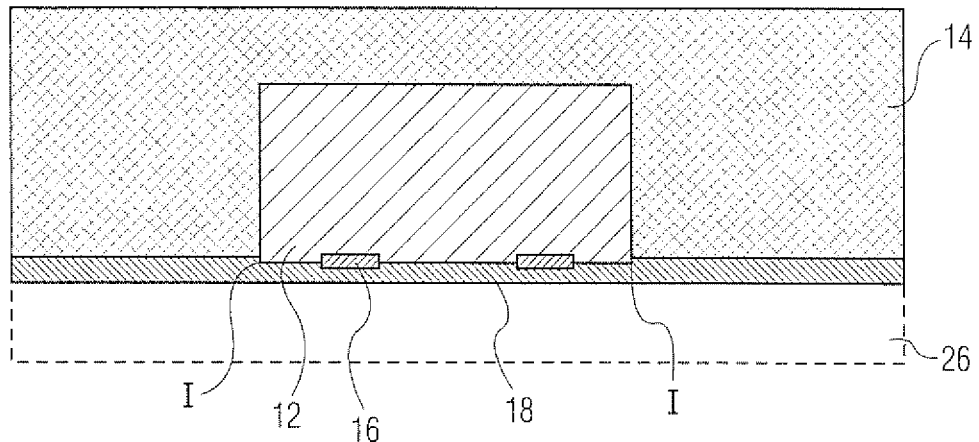

As shown in FIG. 3, a polymeric resin 14 may be deposited on the polymeric dielectric layer 18 to cover the polymeric dielectric layer and substantially embed the semiconductor die or chip 12 in the polymeric resin 14. Polymeric resin 14 may be, for example, a thermoset polymeric resin or a liquid crystal resin. Useful thermoset polymeric resins include, as illustrative examples without limiting the choice of resins to only these examples, phenol-formaldehyde resins; epoxy resins, or polyimide resins. Illustrative examples of useful liquid crystal resins include, without limiting the choice of liquid crystal resins to these examples, polyesters containing p-hydroxybenzoic acid, p-(4-hydroxyphenyl) benzoic acid, or related monomers. If the polymeric resin layer 14 is supported on an optional sacrificial substrate 26 (shown in dashed lines in FIG. 3), the sacrificial substrate 26 is then removed. If the sacrificial substrate 26 is a metal foil, the sacrificial substrate may be removed by etching. If the sacrificial substrate 26 is a flexible polymeric foil bonded to the dielectric layer directly or through an optional release layer, the sacrificial substrate 26 may be removed by peeling the flexible polymeric foil away from the dielectric layer 18. After removal of the sacrificial layer 26 (if present), the resulting structure includes a semiconductor die or chip 12 embedded in polymeric resin 14 so as to expose one surface of die or chip 12.

The dielectric polymeric layer 18, which may be continuous or discontinuous, covers at least bond pads 16 on die or chip 12, and preferably the entire exposed face of die or chip 12. If dielectric polymeric layer 18 is continuous, it covers the exposed face of die or chip 12 and the surface of polymeric resin 14, as seen in FIG. 3. If dielectric polymeric layer 18 is discontinuous, it covers at least the exposed face of die or chip 12, preferably the exposed face of die or chip 12 and an interface I between die or chip 12 and polymeric resin 14.

Figure 4:
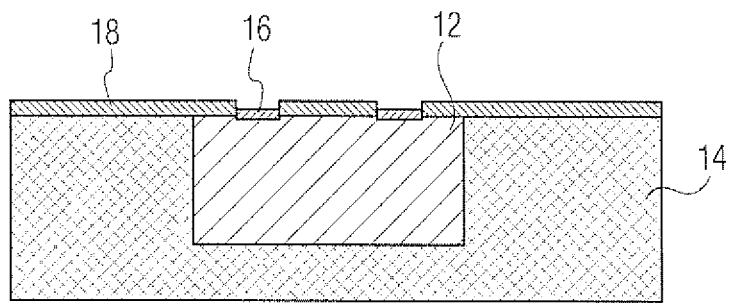

In the next step of making an example chip scale package according to one or more of the exemplary embodiments, at least two selected bond pads 16 in the array of bond pads 16 on the semiconductor die or chip 12 are exposed by defining holes in polymeric dielectric layer 18 over the selected bond pads 16, as seen in FIG. 4. Holes in polymeric layer 18 may be defined by depositing a patterned etch mask which completely covers layer 18, except for defined regions of layer 18 over selected bond pads 16 which are exposed through the etch mask. The exposed regions of layer 18 may be removed by dry etching or by wet etching. For example, an exposed portion of polymeric layer 18 formed from benzocyclobutene resin may be removed by dry etching using $CF_4/O_2$ and $SF_6/O_2$ plasmas. A polymeric layer 18 formed from polyamide resin may undergo wet etching using 3N hydrochloric acid or a mixed solution of hydrochloric acid and stannic chloride. Additionally, holes in polymeric layer 18 over the selected bond pads 16 may be defined by burning or ablating holes through the polymeric resin layer over the selected bond pads 16 with a laser. Use of a laser to define holes in polymeric layer 18 over the selected bond pads 16 has the advantage that the step of depositing an etch mask is unnecessary. Other techniques for selectively removing portions of polymeric layer are also contemplated.

Figure 5:
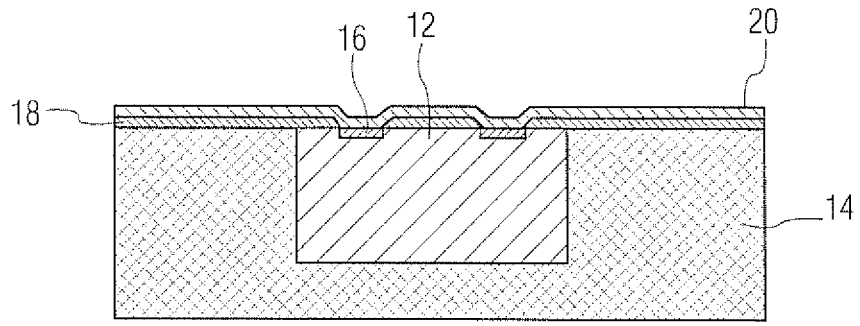

After holes are defined in polymeric layer 18 over the selected bond pads 16, a metal layer 20 is deposited over polymeric dielectric layer 18 so that the metal layer 20 is electrically insulated from semiconductor die or chip 12, except where holes have been defined in polymeric dielectric layer 18 over the selected bond pads 16, as seen in FIG. 5. These holes in layer 18 allow metal layer 20 to make electrical contact with the selected bond pads 16. The metal layer 20 may be formed from a metal having excellent conductivity, such as copper, aluminum, gold, chromium, silver, or alloys thereof. The high conductivity metal layer 20 may be positioned on top of an optional metal-based barrier layer line of a material such as, for example, titanium/titanium nitride (Ti/TiN), nickel (Ni) and/or chromium (Cr) (not shown in the drawings). The optional barrier layer line, if present, may be formed by chemical vapor deposition on the dielectric polymeric layer by physical vapor deposition, electroplating, electroless plating processes, or sputtering or a combination of these techniques, or any other suitable techniques, alone or in combination. The metal layer 20 may be formed by chemical vapor deposition on the dielectric polymeric layer or, if present, on the optional barrier layer line by physical vapor deposition, electroplating, electroless plating processes, or sputtering or a combination of these techniques, or any other suitable techniques, alone or in combination.

Figure 6:
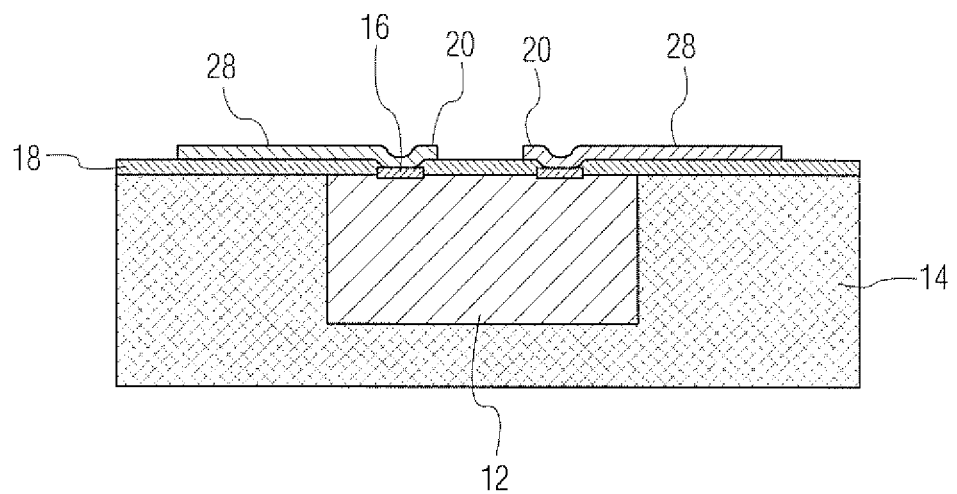

As seen in FIG. 6, the next step in fabrication of a chip scale package according to the exemplary embodiments involves patterning layer 20 to define a plurality of electrical leads 28 which each extend from one of the selected bond pads 16. Preferably, leads 28 do not make electrical contact with each other. In various embodiments, the metal layer 20 is patterned with a laser to define a plurality of leads 28. In certain embodiments, the metal layer 20 is patterned by etching. The metal layer 20 may be etched by depositing a photoresist composition on layer 20, patterning the photoresist to define soluble regions and insoluble regions, and dissolving the soluble portion of the photoresist to expose portions of the metal layer 20. The insoluble portion of the photoresist protects the portions of the metal layer 20 which will define leads 28. The exposed portions of metal layer 20 are then removed by etching. For example, an aluminum layer 20 may be etched with a mixture of 80% phosphoric acid ($H_3PO_4$), 5% acetic acid, 5% nitric acid ($HNO_3$), and 10% water. A chromium layer 20 may be etched with a solution of ceric ammonium nitrate and nitric acid, or with hydrochloric acid. A copper layer 20 or aluminum layer 20 may be etched with a ferric chloride solution, while a silver layer 20 may be etched with ferric nitrate solutions. After etching, the photoresist layer is removed.

Figure 7:
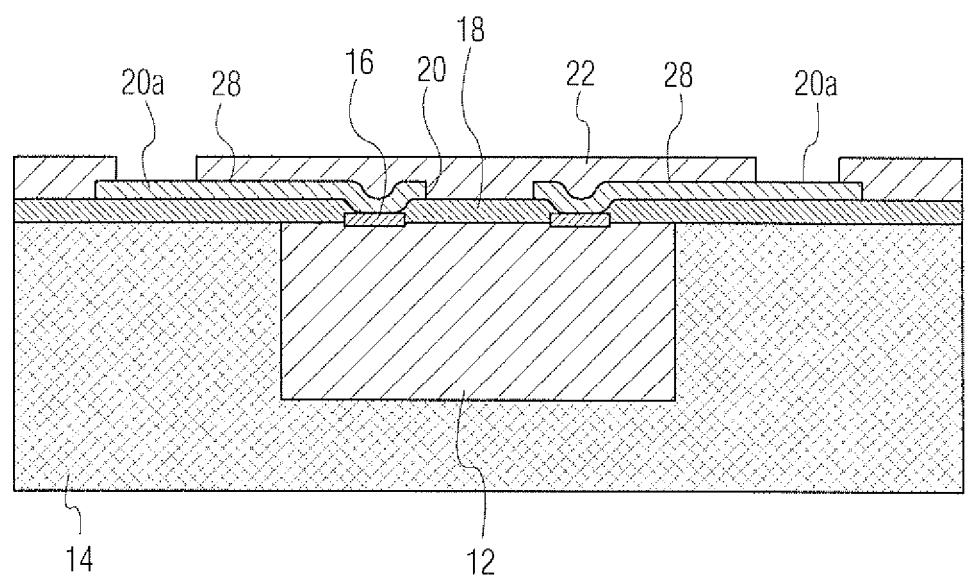

As seen in FIG. 7, the next step in fabrication of the chip scale package according to the exemplary embodiments is deposition of a solder mask 22 over patterned conductive layer 20. The solder mask is patterned to expose bond pads 20a and to protect other structures. In various embodiments, each bond pad 20a is an exposed portion of patterned conductive layer 20, located at an end of an electrical lead 28 defined by patterned conductive layer 20 and covered by solder mask 22. In various embodiments, the solder mask 22 may be made from a lacquer like layer of polymer that provides a permanent protective coating for the electrical leads 28 defined by conductive layer 20. The solder mask prevents solder from bridging between conductors, thereby preventing short circuits. In various embodiments, the solder mask is formed from a UV-curable epoxy liquid that is silkscreened through a woven mesh on to the dielectric layer 18 and the patterned conductive layer 20, where an ink-blocking stencil prevents transfer of the epoxy liquid onto at least some of bond pads 20a. The applied epoxy solder mask is then cured. Other types of solder mask which can be used include photoimageable solder masks, including liquid photoimageable solder mask (LPSM) inks and dry film photoimageable solder masks (DFSM). LPSM can be silkscreened or sprayed on the dielectric layer 18 and the patterned conductive layer 5. DFSM is vacuum laminated onto the dielectric layer 4 and the patterned conductive layer 20. The LPSM or DFSM solder mask layer is then imaged through a photomask with UV radiation to provide a partially cured patterned layer having unexposed and uncured portions over at least some of bond pads 20a. The LPSM or DFSM layer is then developed by removing the uncured portions of the solder mask layer to provide openings in the solder mask layer for parts to be soldered to the bond pads 20a. After the unexposed portion of the solder mask layer is removed, the remaining solder mask layer is fully cured with UV radiation and/or heat.

Figure 8:
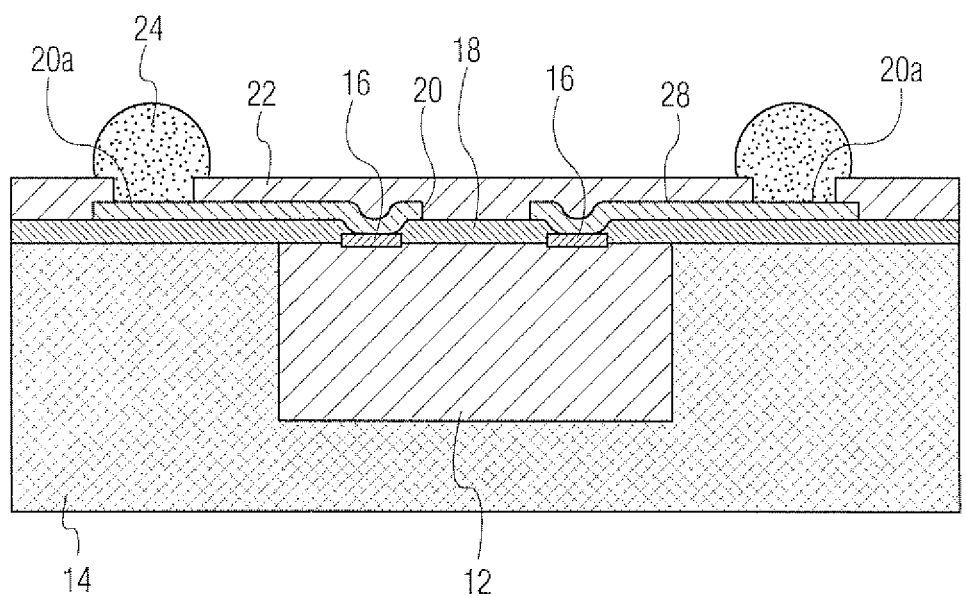

Solder 24 is then deposited on exposed bond pads 20a, as seen in FIG. 8. The solder may be deposited by screen printing or by depositing preformed solder bumps 24 onto bond pads 20a. Solders which may be used to form solder bumps 24 or printed onto bond pads 20a include, for example, lead-free solders.

As may be seen in FIG. 8, patterned metal layer 20 serves as a redistribution layer, where the metal leads 28 defined by patterned layer 20 allow electrical contacts to the densely spaced bond pads 16 on the semiconductor die or chip 12 to be made by making electrical contacts to the less densely spaced bond pads 20a through solder bumps 24. Each electrical lead 28 defined by the patterned metal redistribution layer 20 "fans out" from the semiconductor die or chip 12, so as to electrically connect a bond pad 16 to a bond pad 20a; thus, metal leads 28 enable redistribution of the exposed bond pads for making electrical contact to die or chip 12 so that the less densely spaced bond pads 20a are used in place of the densely spaced bond pads 16.

Solder balls 24 may now be used to solder the semiconductor die or chip 12 to a printed circuit board (not shown).

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. More specifically, this invention is applicable to any suitable semiconductor die or chip construction, including, but not limited to, those in conformance with the standards described in this specification. Elements and compositions described herein are exemplary and not limiting. Accordingly, the foregoing disclosure, description, and figures are for illustrative purposes only and do not in any way limit the invention, which is defined only by the claims.

What is claimed is:

1. A method of making a chip scale package, comprising:
   providing a semiconductor die having a first area supporting a plurality of first bond pads;
   arranging a dielectric layer over at least a portion of the first area;
   embedding the semiconductor die in a die support body formed of a molding material, in an orientation and position wherein the dielectric layer over at least the portion of the first area is exposed;
   exposing at least two of the plurality of first bond pads by opening a hole in the dielectric layer over each of said at least two of the plurality of first bond pads;
   forming a plurality of electrical leads on the dielectric layer, each of said electrical leads forming at least one second bond pad and extending from the at least one second bond to a corresponding one of the plurality of first bond pads, wherein said plurality of first bond pads are arranged in a first arrangement having a first density of bond pads per unit area and the second bond pads have a second arrangement having a second density of bond pads per unit area that is less than said first density; and
   forming a conducting bump on at least one of the second bond pads.

2. The method of claim 1, wherein said dielectric layer is a self-supporting polymeric film structure.

3. The method of claim 2, wherein said self-supporting polymeric film structure is a dielectric polymeric film supported on a sacrificial substrate, and said arranging step includes positioning said first face of the semiconductor die on said self-supporting polymeric film structure, and said method further comprises:
   removing said sacrificial substrate after said embedding the semiconductor die in a die support body formed of a molding material.

4. The method of claim 3, wherein a sacrificial substrate is a metal foil selected from a group consisting of copper, aluminum, and chromium, and wherein said removing said sacrificial substrate includes an etching.

5. The method of claim 3, wherein a sacrificial substrate is a flexible polymeric foil bonded to said dielectric layer, and said removing said sacrificial substrate includes a peeling of said flexible polymeric foil away from said dielectric layer.

6. The method of claim 2, wherein an outer perimeter of said semiconductor die surrounds said first area, said arranging step arranges the self-supporting dielectric layer to have portions extending beyond said outer perimeter, and said embedding step forms a layer support surface of the die support body at said portions of said dielectric layer extending beyond said outer perimeter.

7. The method of claim 6, wherein said forming the plurality of electrical leads over said dielectric layer includes:
   forming a portion of at least one of said plurality of electrical leads by at least a portion of the layer support surface of the die support body.

8. The method of claim 7, wherein said forming the plurality of electrical leads includes:
   forming a conductive layer over at least a portion of said dielectric layer, wherein said conductive layer contacts at least two of said first bond pads; and
   patterning said conductive layer to form a first electrical lead having a second bond pad and extending from said second bond pad to a first of said at least two first bond pads, and to form a second electrical lead having another second bond pad and extending from said another second bond pad to a second of said at least two first bond pads.

9. The method of claim 8, wherein said forming the conducting bump includes:
   forming a solder mask over at least a first of said least two electrical leads formed by said patterning, having an opening exposing said at least one second bond pad; and
   arranging a solder bump within said opening.

10. The method of claim 2, wherein said first bond pads are arranged in a first arrangement having a first minimum center-to-center bond pad spacing, and said forming the plurality of electrical leads on the dielectric layer forms said second bond pads in a second arrangement having a second minimum center-to-center bond pad spacing.

11. The method of claim 10, wherein the first minimum center-to-center bond pad spacing is smaller than the second minimum center-to-center bond pad spacing.

12. The method of claim 1, wherein said forming the conducting bump includes:
   forming a solder mask over at least a first of said least two electrical leads, having an opening exposing said at least one second bond pad; and
   arranging a solder bump within said opening.

13. The method of claim 1, wherein at least some of the second bond pads are disposed on the die support body so that, viewed in a direction substantially perpendicular to a plane in which the second bond pads lie, the second bond pads are located beyond a projection of a perimeter of the semiconductor die.

14. The method of claim 1, wherein at least one first bond pad is electrically connected to another first bond pad.

* * * * *